United States Patent
Huang et al.

(10) Patent No.: US 10,269,576 B1
(45) Date of Patent: Apr. 23, 2019

(54) ETCHING AND STRUCTURES FORMED THEREBY

(71) Applicant: Taiwan Semiconductor Manufacturing Co., Ltd., Hsinchu (TW)

(72) Inventors: Kuan-Wei Huang, Taoyuan (TW); Yu-Yu Chen, Hsinchu (TW); Chia-Nan Lin, Zhu-ki (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 15/814,082

(22) Filed: Nov. 15, 2017

(51) Int. Cl.
| | |
|---|---|
| *H01L 21/461* | (2006.01) |
| *H01L 21/306* | (2006.01) |
| *H01L 21/67* | (2006.01) |
| *H01L 21/3065* | (2006.01) |
| *H01L 21/02* | (2006.01) |
| *H01L 21/3105* | (2006.01) |
| *H01L 21/311* | (2006.01) |

(52) U.S. Cl.
CPC .... *H01L 21/30604* (2013.01); *H01L 21/0214* (2013.01); *H01L 21/02458* (2013.01); *H01L 21/3065* (2013.01); *H01L 21/31053* (2013.01); *H01L 21/31105* (2013.01); *H01L 21/31116* (2013.01); *H01L 21/67069* (2013.01); *H01L 21/67075* (2013.01)

(58) Field of Classification Search
CPC ......... H01L 21/31053; H01L 21/31105; H01L 21/31116; H01L 21/0214; H01L 21/02458
USPC ........................................ 438/705, 724, 744
See application file for complete search history.

(56) References Cited

U.S. PATENT DOCUMENTS

| | | |
|---|---|---|
| 5,385,630 A | 1/1995 | Philipossian et al. |
| 9,093,530 B2 | 7/2015 | Huang et al. |
| 9,171,929 B2 | 10/2015 | Lee et al. |
| 9,214,555 B2 | 12/2015 | Oxland et al. |
| 9,236,267 B2 | 1/2016 | De et al. |
| 9,299,583 B1* | 3/2016 | Wang ................ H01L 21/31122 |
| 9,520,482 B1 | 12/2016 | Chang et al. |
| 9,548,303 B2 | 1/2017 | Lee et al. |
| 9,564,489 B2 | 2/2017 | Yeo et al. |
| 9,576,814 B2 | 2/2017 | Wu et al. |
| 9,601,342 B2 | 3/2017 | Lee et al. |
| 9,608,116 B2 | 3/2017 | Ching et al. |
| 2002/0121502 A1 | 9/2002 | Patel et al. |
| 2003/0216031 A1* | 11/2003 | Komagata ........... H01L 21/0276 438/636 |
| 2005/0159008 A1 | 7/2005 | Chang et al. |
| 2009/0298274 A1 | 12/2009 | Kajiwara |
| 2012/0138886 A1 | 6/2012 | Kuhn et al. |

(Continued)

*Primary Examiner* — Binh X Tran
(74) *Attorney, Agent, or Firm* — Slater Matsil, LLP

(57) ABSTRACT

Embodiments described herein relate generally to methods for etching structures and the structures formed thereby. In some embodiments, an etch selectivity between a first portion of a material and a second portion of the material is increased. Increasing the etch selectivity includes performing an anisotropic treatment, such as an anisotropic ion implantation, on the material to treat the first portion of the material, and the second portion of the material remains untreated after the anisotropic treatment. After increasing the etch selectivity, the first portion of the material is etched. The etching may be a wet or dry etch, and may further be isotropic or anisotropic.

20 Claims, 11 Drawing Sheets

(56) References Cited

U.S. PATENT DOCUMENTS

| | | | |
|---|---|---|---|
| 2014/0187046 A1* | 7/2014 | Posseme | H01L 21/0217 438/696 |
| 2014/0273292 A1* | 9/2014 | Posseme | H01L 21/3065 438/5 |
| 2016/0035581 A1 | 2/2016 | Posseme et al. | |
| 2016/0041464 A1 | 2/2016 | Hashimoto et al. | |
| 2016/0181117 A1 | 6/2016 | Arghavani et al. | |

* cited by examiner

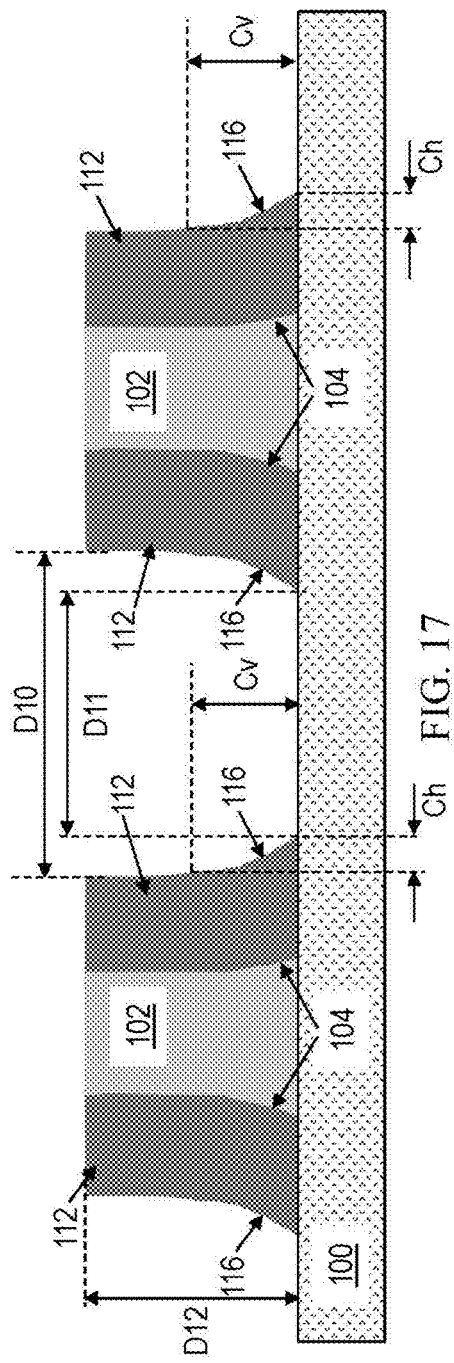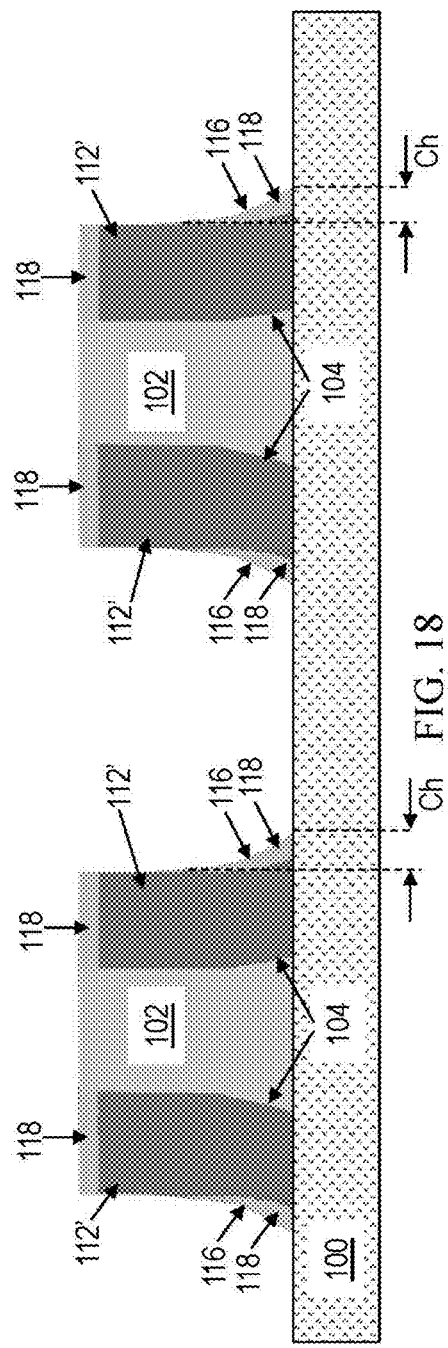

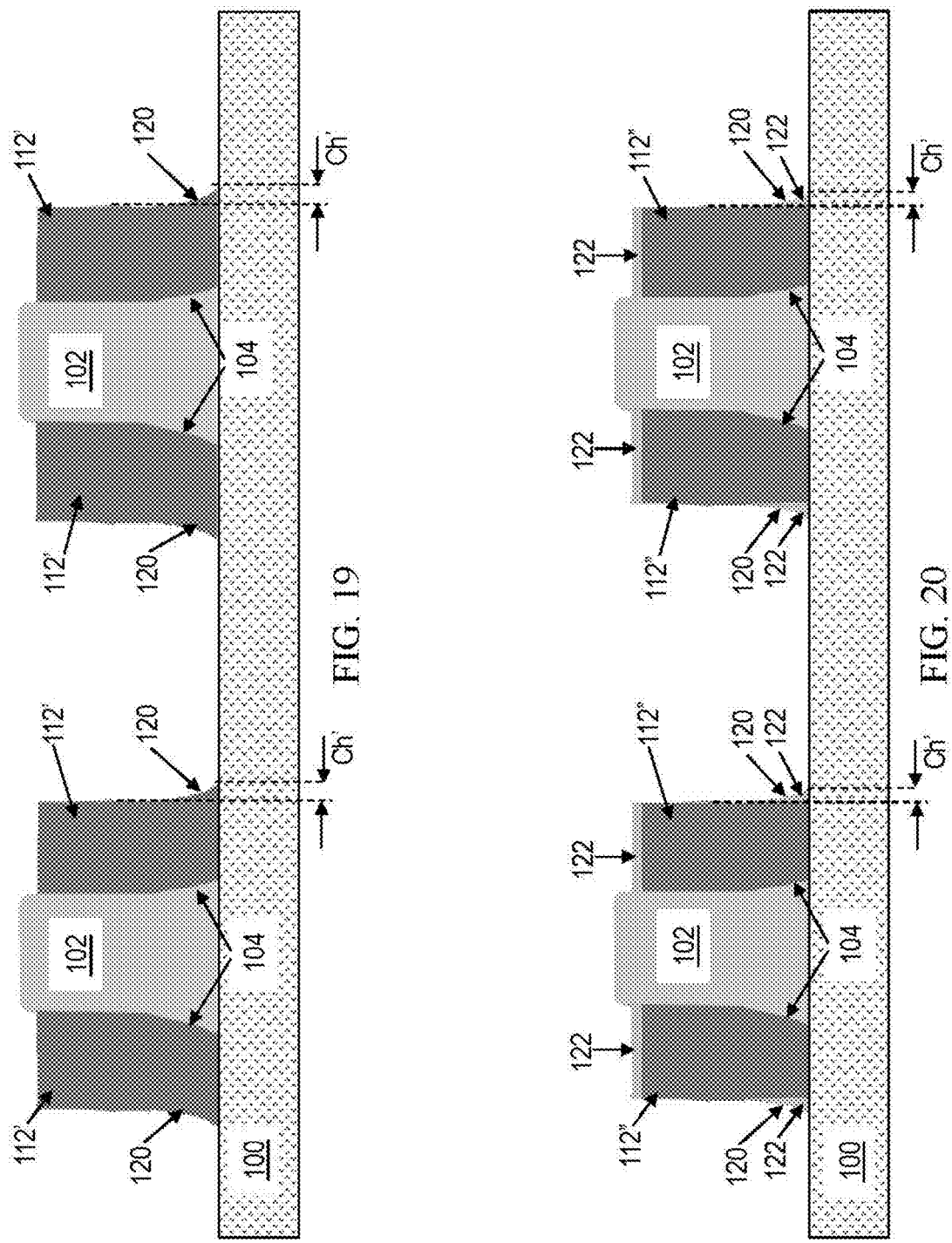

ETCHING AND STRUCTURES FORMED THEREBY

BACKGROUND

Double patterning is a technology developed for lithography to enhance feature density in integrated circuits. Typically, the lithography technology is used for forming features of integrated circuits on wafers. The lithography technology involves applying a photo resist and defining patterns in the photo resist. The patterns in the photo resist are first defined in a lithography mask, and are implemented either by the transparent portions or by the opaque portions of the lithography mask. The patterns in the lithography mask are transferred to the photo resist through an exposure using the lithography mask, followed by the development of the photo resist. The patterns in the patterned photo resist are then transferred to the manufactured features, which are formed on a wafer.

Various techniques have been created to implement double or multiple patterning. One technique is a lithography-etch-lithograph-etch (LELE) technique. In a LELE technique, a pattern is generally divided into multiple parts to be implemented using multiple, respective lithography followed by etch steps. Another technique is a self-aligned technique. In a self-aligned technique, a pattern is generally formed by forming a mandrel and spacers on sidewalls of the mandrel, where the spacers are the pattern to be formed in the underlying substrate. In these techniques, the goal is to decrease a width between neighboring features, thereby increasing density.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 15 through 22 are cross-sectional views of respective intermediate structures during an example method for patterning structures in accordance with some embodiments.

DETAILED DESCRIPTION

Figure 1:
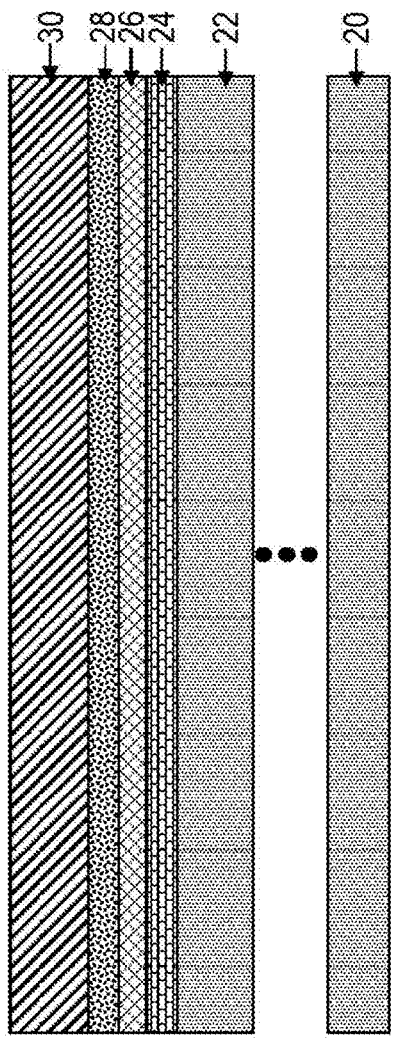
FIGS. 1 through 14 are cross-sectional views of respective intermediate structures during an example method for forming conductive features in a dielectric layer using a self-aligned double patterning technique in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments described herein relate generally to one or more methods for etching structures in semiconductor processing. Generally, an anisotropic treatment of a material, layer, and/or spacer to be etched can be implemented to increase etching selectivity between treated and non-treated portions of the material, layer, and/or spacer, and an etch process can be performed that is selective to the treated portions. Hence, the etch process can avoid some challenges that may be associated with critical dimension loading, linearity loading, and other challenges.

Etching, as described herein, may be used to form a mask for subsequent patterning of one or more layers on a semiconductor substrate and/or the semiconductor substrate itself. Some embodiments described herein are in the context of self-aligned double patterning (SADP), and a person having ordinary skill in the art will readily understand modifications to extend etching described herein to other patterning techniques, such as self-aligned quadruple patterning (SAQP) or the like. Other etching within the scope of other embodiments may be performed in other contexts, such as forming gate spacers on gate stacks, forming recesses in substrates such as in dielectric layers, and other contexts. Various modifications are discussed with respect to disclosed embodiments; however, other modifications may be made to disclosed embodiments while remaining within the scope of the subject matter. A person having ordinary skill in the art will readily understand other modifications that may be made that are contemplated within the scope of other embodiments. Although method embodiments may be described in a particular order, various other method embodiments may be performed in any logical order and may include fewer or more steps than what is described herein.

FIGS. 1 through 14 illustrate cross-sectional views of respective intermediate structures during an example method for forming conductive features in a dielectric layer using, for example, a self-aligned double patterning technique, in accordance with some embodiments. FIG. 1 illustrates a dielectric layer 22 over a semiconductor substrate 20. The semiconductor substrate 20 may be or include a bulk semiconductor, a semiconductor-on-insulator (SOI) substrate, or the like, which may be doped (e.g., with a p-type or an n-type dopant) or undoped. Generally, an SOI substrate comprises a layer of a semiconductor material formed on an insulator layer. The insulator layer may be, for example, a buried oxide (BOX) layer, a silicon oxide layer, or the like. The insulator layer is provided on or is a substrate, typically a silicon or glass substrate. Other substrates, such as a multi-layered or gradient substrate may also be used. In some embodiments, the semiconductor material of the semiconductor substrate may include silicon (Si); germanium (Ge); a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or a combination thereof.

Various devices may be on the semiconductor substrate 20. For example, the semiconductor substrate 20 may include Field Effect Transistors (FETs), such as Fin FETs (FinFETs), planar FETs, vertical gate all around FETs (VGAA FETs), or the like; diodes; capacitors; inductors; and other devices. Devices may be formed wholly within the semiconductor substrate 20, in a portion of the semiconductor substrate 20 and a portion of one or more overlying layers, and/or wholly in one or more overlying layers, for example. Etching described herein may be used in the processing to form and/or to interconnect the devices to form an integrated circuit. The integrated circuit can be any circuit, such as for an Application Specific Integrated Circuit (ASIC), a processor, memory, or other circuit.

The dielectric layer 22 is above the semiconductor substrate 20. The dielectric layer 22 may be directly on the semiconductor substrate 20, or any number of other layers may be disposed between the dielectric layer 22 and the semiconductor substrate 20. For example, the dielectric layer 22 may be or include an Inter-Layer Dielectric (ILD) or an Inter-Metal Dielectric (IMD). The dielectric layer 22, for example, may be or comprise a low-k dielectric having a k-value less than about 4.0, such as about 2.0 or even less. In some examples, the dielectric layer 22 comprises phosphosilicate glass (PSG), borophosphosilicate glass (BPSG), fluorosilicate glass (FSG), $SiO_xC_y$, Spin-On-Glass, Spin-On-Polymers, silicon carbon material, a compound thereof, a composite thereof, or a combination thereof. The dielectric layer 22 may be deposited using a Chemical Vapor Deposition (CVD), such as Plasma Enhanced CVD (PECVD) or Flowable CVD (FCVD); spin-on coating; or another deposition technique. In some examples, a Chemical Mechanical Planarization (CMP) or another planarization process may be performed to planarize the top surface of dielectric layer 22.

A mask stack is above the dielectric layer 22. The mask stack includes a first mask sub-layer 24, a second mask sub-layer 26, and a third mask sub-layer 28. In other examples, the mask stack may be or include one layer or any number of different layers. The first mask sub-layer 24 is above the dielectric layer 22. The second mask sub-layer 26 is above the first mask sub-layer 24. The third mask sub-layer 28 is above the second mask sub-layer 26.

The first mask sub-layer 24 may be or comprise an Anti-Reflective Coating (ARC), such as a Nitrogen-Free ARC (NFARC) (e.g., a silicon-rich oxide (SRO)), or the like. The second mask sub-layer 26 may be or comprise a nitride layer, such as titanium nitride (TiN), silicon nitride (SiN), tantalum nitride (TaN), the like, or a combination thereof. The third mask sub-layer 28 may be or comprise an oxide layer, such as tetraethylorthosilicate (TEOS), the like, or a combination thereof. The sub-layers of the mask stack (e.g., the first mask sub-layer 24, the second mask sub-layer 26, and the third mask sub-layer 28) may each be formed using CVD, Physical Vapor Deposition (PVD), Atomic Layer Deposition (ALD), or another deposition technique.

A mandrel layer 30 is above the mask stack (e.g., above the third mask sub-layer 28). The mandrel layer 30 may be or comprise a silicon layer, such as an amorphous silicon layer, the like, or a combination thereof. The mandrel layer 30 may be formed using CVD, PVD, ALD, or another deposition technique. The mandrel layer 30 can have a thickness in a range from about 30 nm to about 70 nm.

In subsequent figures, the semiconductor substrate 20 may be omitted to avoid obscuring features illustrated in those figures. A person having ordinary skill in the art will readily understand that the semiconductor substrate 20 is nevertheless present in the structures illustrated in those figures.

Figure 2:
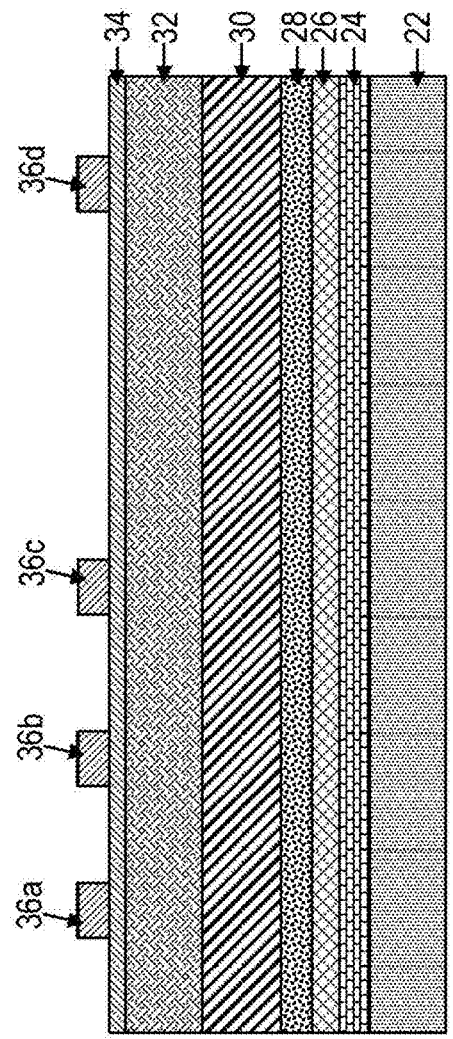

FIG. 2 illustrates the intermediate structure of FIG. 1 after further processing. A bottom layer 32 (e.g., a sacrificial layer) is formed above the mandrel layer 30. The bottom layer 32 may be or comprise a hard mask material, such as a carbon-containing material, and may be formed using spin-on coating, CVD, PVD, ALD, or another deposition technique. In an example, the bottom layer 32 is a polymer material, such as an oxide, formed by spin-on coating. The bottom layer 32 can have a thickness in a range from about 50 nm to about 150 nm.

A middle layer 34 (e.g., a sacrificial layer) is formed above the bottom layer 32. The middle layer 34 may be or comprise another mask material, such as a carbon-containing material like silicon oxycarbide (SiOC), and may be formed using CVD, PVD, ALD, or another deposition technique. In an example, the middle layer 34 is SiOC. The middle layer 34 can have a thickness in a range from about 10 nm to about 35 nm.

A photo resist is formed above the middle layer 34, such as by using spin-on coating, and is patterned by exposing the photo resist to light using an appropriate photomask. Exposed or unexposed portions of the photo resist may then be removed depending on whether a positive or negative resist is used. Patterned photo resist portions 36a-d remain above the middle layer 34.

Figure 3:
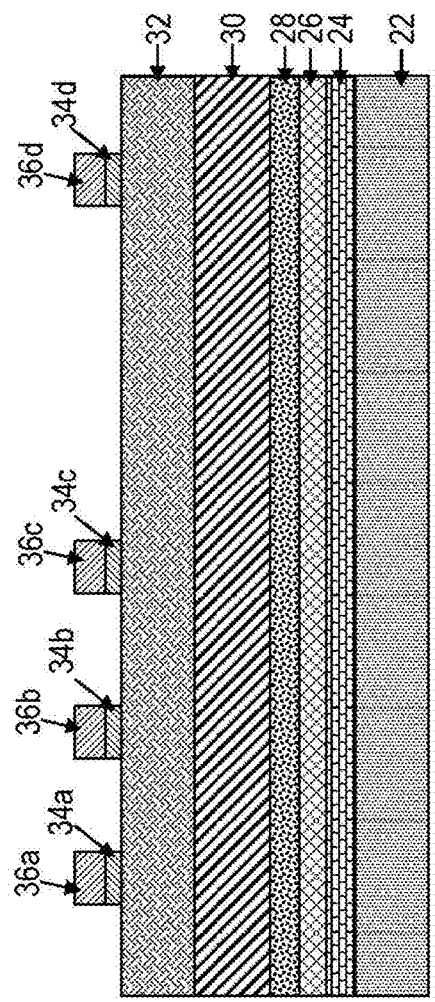

FIG. 3 illustrates the intermediate structure of FIG. 2 after further processing. An etch process is performed that transfers the pattern of the patterned photo resist portions 36a-d to the underlying middle layer 34 to form patterned middle layer portions 34a-d corresponding to the patterned photo resist portions 36a-d. The etch process can be any suitable etch process, such as a reactive ion etch (RIE), neutral beam etch (NBE), the like, or a combination thereof. The etch process can be a dry etch process that uses, for example, a gas comprising carbon tetrafluoride ($CF_4$) and fluoroform ($CHF_3$). A ratio of the flow rate of the carbon tetrafluoride ($CF_4$) to a flow rate of the fluoroform ($CHF_3$) can be in a range from about 0.2 to about 10, such as from about 1 to about 3.5. Subsequently, the patterned photo resist portions 36a-d may be removed in an ashing and/or wet strip processes, for example.

Figure 4:
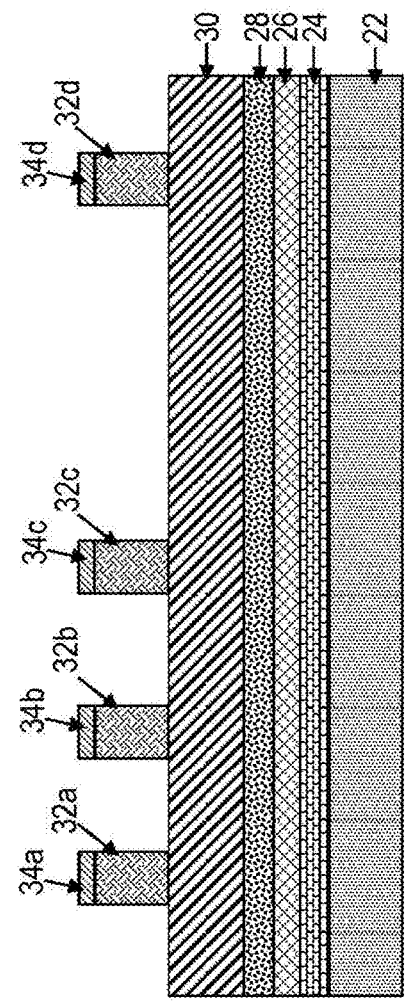

FIG. 4 illustrates the intermediate structure of FIG. 3 after further processing. An etch process is performed that transfers the pattern of the patterned middle layer portions 34a-d to the underlying bottom layer 32 to form patterned bottom layer portions 32a-d corresponding to the patterned middle layer portions 34a-d. The etch process can be any suitable etch process, such as RIE, NBE, the like, or a combination thereof. The etch process can be a dry etch process that uses, for example, a gas comprising oxygen ($O_2$) and chlorine ($Cl_2$). A ratio of the flow rate of the oxygen ($O_2$) to a flow rate of the chlorine ($Cl_2$) can be in a range from about 0.3 to about 4.

Figure 5:
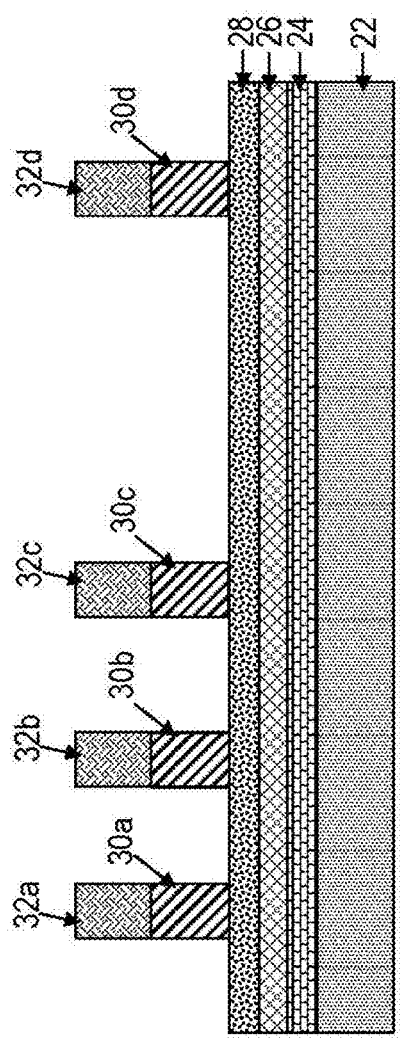

FIG. 5 illustrates the intermediate structure of FIG. 4 after further processing. One or more etch processes are performed that removes the patterned middle layer portions 34a-d and that recesses the pattern of the patterned bottom layer portions 32a-d to the underlying mandrel layer 30 to form patterned mandrels 30a-d corresponding to the patterned bottom layer portions 32a-d. The etch processes can be any suitable etch process. For example, the etch processes can be a plasma-based etch, such as an RIE, the like or a combination thereof. A first etch process can remove the patterned middle layer portions 34a-d and recess the mandrel layer 30, and can be a dry etch process that uses, for example, a gas comprising carbon tetrafluoride ($CF_4$) and fluoroform ($CHF_3$). A ratio of the flow rate of the carbon tetrafluoride ($CF_4$) to a flow rate of the fluoroform ($CHF_3$) can be in a range from about 0.2 to about 10, such as from about 1 to about 3.5. A second etch process can pattern the mandrel layer 30 and can be a dry etch process that uses, for example, a gas comprising one or more of carbon tetrafluoride ($CF_4$), chlorine ($Cl_2$), hydrogen bromide (HBr), or the like. For example, the dry etch process can use hydrogen bromide (HBr); a combination of carbon tetrafluoride ($CF_4$), chlorine ($Cl_2$), and hydrogen bromide (HBr); a combination of chlorine ($Cl_2$) and hydrogen bromide (HBr); and/or a combination of carbon tetrafluoride ($CF_4$) and chlorine ($Cl_2$). Oxygen ($O_2$) may also be used in the dry etch process, which may enhance selectivity of the etch process.

Figure 6:
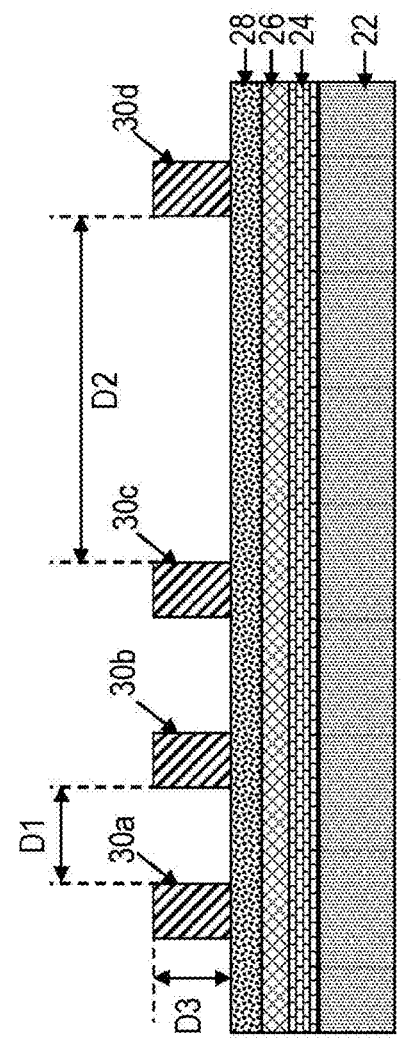

FIG. 6 illustrates the intermediate structure of FIG. 5 after further processing. An ash and/or etch process selective to the material of the bottom layer 32 is performed to remove the remaining patterned bottom layer portions 32a-d. The ash and/or etch process may be a plasma-based process. For example, the plasma-based process may be an oxygen ($O_2$) dry etch plasma. Patterned mandrels 30a-d remain above the mask stack.

A first dimension D1 is between facing sidewalls of neighboring patterned mandrels 30a and 30b, and a second dimension D2 is between facing sidewalls of neighboring patterned mandrels 30c and 30d. In some examples, the first dimension D1 is a smallest dimension between neighboring pairs of the patterned mandrels 30a-d, while the second dimension D2 is a largest dimension between neighboring pairs of the patterned mandrels 30a-d. Hence, the second dimension D2 is greater than the first dimension D1. In some examples, the second dimension D2 can be at least 3 times larger than the first dimension D1. In some examples, the first dimension D1 can be in a range from about 20 nm to about 50 nm, and the second dimension D2 can be in a range from about 50 nm to about 150 nm.

Further, the patterned mandrels 30a-d have a thickness of a third dimension D3, which may be in a range from about 30 nm to about 70 nm. The third dimension D3 may be or correspond to the thickness of the mandrel layer 30 as deposited as described with respect to FIG. 1, although, in some examples, the third dimension D3 may be less than the thickness of the mandrel layer 30 as deposited due to loss resulting from one or more etch processes. In some examples, a first aspect ratio AR1 of a smallest spacing between neighboring pairs of the patterned mandrels 30a-d (e.g., a ratio of the third dimension D3 to the first dimension D1 in the illustrated example of FIG. 6) can be greater than about 0.8 (e.g., and more particularly, greater than about 1.5), such as in a range from about 0.8 to about 4. In some examples, a second aspect ratio AR2 of a largest spacing between neighboring pairs of the patterned mandrels 30a-d (e.g., a ratio of the third dimension D3 to the second dimension D2 in the illustrated example of FIG. 6) can be less than about 1.2 (e.g., and more particularly, less than about 0.6), such as in a range from about 0.1 to about 1.2. In some examples, the first aspect ratio AR1 can be at least 2 times larger than the second aspect ratio AR2.

Figure 7:
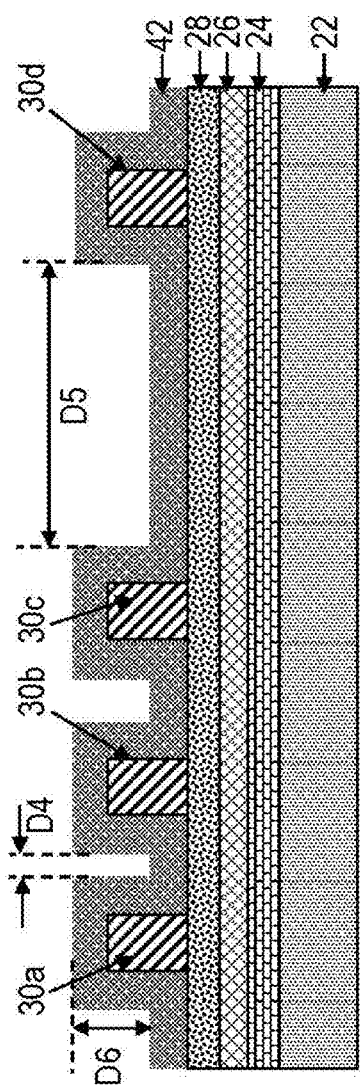

FIG. 7 illustrates the intermediate structure of FIG. 6 after further processing. A spacer layer 42 is formed on the patterned mandrels 30a-d and above the mask stack. The spacer layer 42 is formed conformally on the patterned mandrels 30a-d. The spacer layer 42 may be, for example, titanium oxide, titanium nitride, silicon nitride, or another acceptable material, and may be formed using CVD, ALD, or another deposition technique. The spacer layer 42 may have a thickness in a range from about 5 nm to about 23 nm, and more particularly, from about 9 nm to about 18 nm.

A fourth dimension D4 is between facing sidewalls of the spacer layer 42 on neighboring patterned mandrels 30a and 30b, and a fifth dimension D5 is between facing sidewalls of the spacer layer 42 on neighboring patterned mandrels 30c and 30d. In some examples, the fourth dimension D4 is a smallest dimension between facing sidewalls of the spacer layer 42 on neighboring pairs of the patterned mandrels 30a-d, while the fifth dimension D5 is a largest dimension between facing sidewalls of the spacer layer 42 on neighboring pairs of the patterned mandrels 30a-d. Hence, the fifth dimension D5 is greater than the fourth dimension D4. In some examples, the fifth dimension D5 can be at least 6 times larger than the fourth dimension D4. Generally, the fourth dimension D4 can be or correspond to the first dimension D1 minus twice the thickness of the spacer layer 42, and the fifth dimension D5 can be or correspond to the second dimension D2 minus twice the thickness of the spacer layer 42. In some examples, the fourth dimension D4 can be in a range from about 7 nm to about 35 nm, and the fifth dimension D5 can be in a range from about 20 nm to about 135 nm.

Further, a sixth dimension D6 may be between an upper surface of a horizontal portion of the spacer layer 42 between neighboring pairs of the patterned mandrels 30a-d and an upper surface of a horizontal portion of the spacer layer 42 over a corresponding patterned mandrel 30a-d. Generally, the sixth dimension D6 may be or correspond to the third dimension D3. The sixth dimension D6 may be in a range from about 30 nm to about 70 nm. In some examples, a third aspect ratio AR3 of a smallest spacing between facing sidewalls of the spacer layer 42 on neighboring pairs of the patterned mandrels 30a-d (e.g., a ratio of the sixth dimension D6 to the fourth dimension D4 in the illustrated example of FIG. 7) can be greater than about 2 (e.g., and more particularly, greater than about 4), such as in a range from about 2 to about 8. In some examples, a fourth aspect ratio AR4 of a largest spacing between facing sidewalls of the spacer layer 42 on neighboring pairs of the patterned mandrels 30a-d (e.g., a ratio of the sixth dimension D6 to the fifth dimension D5 in the illustrated example of FIG. 7) can be less than about 1.0 (e.g., and more particularly, less than about 0.5), such as in a range from about 0.1 to about 1.0. In some examples, the third aspect ratio AR3 can be at least 8 times larger than the fourth aspect ratio AR4.

Figure 8:
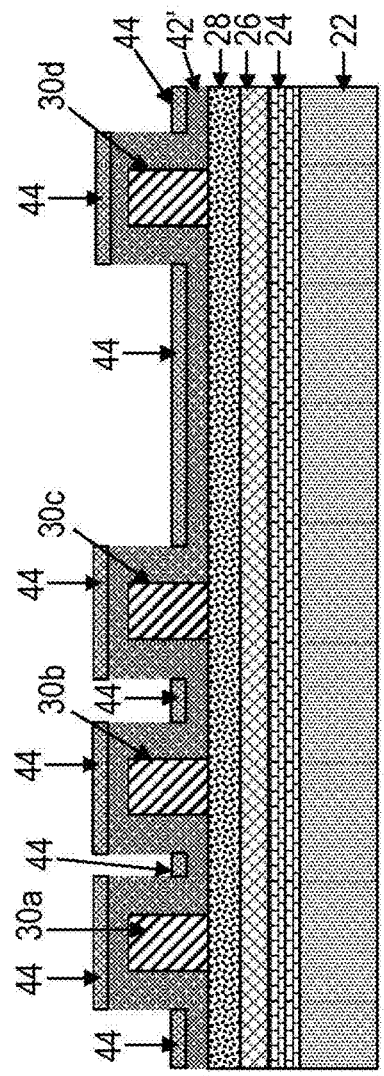

FIG. 8 illustrates the intermediate structure of FIG. 7 after further processing. An anisotropic treatment is performed on the spacer layer 42. The anisotropic treatment forms treated portions 44 from the spacer layer 42, with the untreated spacer layer 42' under the treated portions 44. The anisotropic treatment changes an etch selectivity between the treated portions 44 and the untreated spacer layer 42'. This results, in some embodiments, in a greater selectivity for etching the treated portions 44 in a subsequent etch process, as described subsequently.

The anisotropic treatment forms treated portions 44 along surfaces of the spacer layer 42 that have a lateral or horizontal component. Surfaces that are vertical are not significantly treated. FIG. 8 illustrates the spacer layer 42 having horizontal surfaces and vertical surfaces. Subsequent figures illustrate details of treating surfaces having both horizontal and vertical components. As shown in FIG. 8, the anisotropic treatment forms treated portions 44 to some depth below the horizontal surfaces, while the vertical surfaces are not significantly treated. At least respective portions of the untreated spacer layer 42' remain underlying the treated portions 44 in FIG. 8. A depth of the treated portions 44 in the spacer layer 42 may be in a range from about 1 nm to about 10 nm, and more particularly, from about 2 nm to about 6 nm.

In some examples, the anisotropic treatment is an anisotropic ion implantation. Further, in some examples, the species implanted into the spacer layer 42 during the anisotropic ion implantation can be or include hydrogen ($H_2$), helium (He), the like, or a combination thereof. For example, the species can have a low atomic weight and be a small ion, which may be capable of penetrating deeper into the spacer layer 42 by the implantation.

In some examples, the anisotropic ion implantation may use a plasma generator with a low frequency, such as about 2 MHz or less, and with a power of greater than or equal to about 50 W, such as in a range from about 50 W to about 600 W, and more particularly, such as about 100 W. The implantation may be performed for a duration greater than or equal to about 7 seconds, such as in a range from about 7 seconds to about 30.

In other examples, the anisotropic ion implantation may use a plasma generator with a frequency of about 13.56 MHz, and with a power of greater than or equal to about 300 W, such as in a range from about 300 W to about 1,000 W. The implantation may be performed for a duration greater than or equal to about 7 seconds, such as in a range from about 7 seconds to about 30 seconds.

In examples using an anisotropic ion implantation, the implantation of ions breaks chemical bonds of the material of the spacer layer 42, which generally permits increased etch selectivity between the treated portions 44 and the untreated spacer layer 42'. Further, implanting a higher concentration of ions can break more chemical bonds of the material of the spacer layer 42 (relative to a number of chemical bonds broken when a lower concentration of ions are implanted), which can further increase etch selectivity between the treated portions 44 and the untreated spacer layer 42'.

Figure 9:
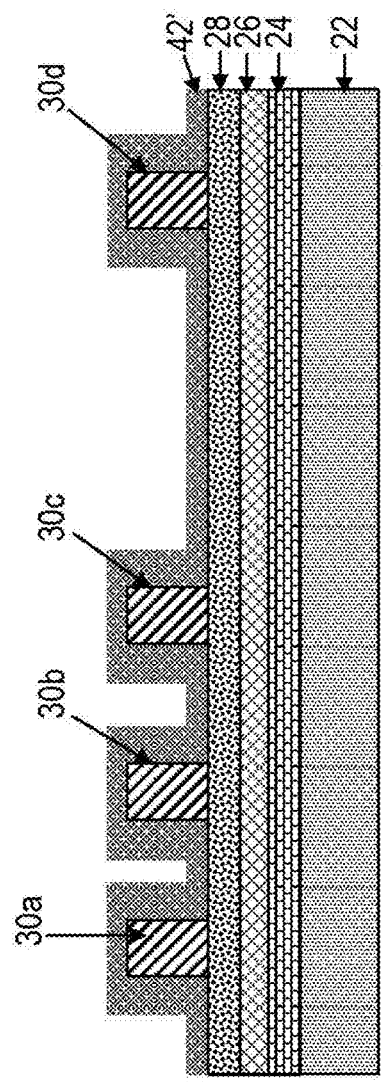

FIG. 9 illustrates the intermediate structure of FIG. 8 after further processing. An etch process is performed. The etch process has a high selectivity to etch the treated portions 44 and not to significantly etch the untreated spacer layer 42'. The etch process can be a wet etch or a dry etch, and may be isotropic or anisotropic.

In some examples, the etch process is a dry plasma etch using a gas comprising chlorine ($Cl_2$) and $CH_4$, in which the $CH_4$ may be a reductant for a spacer etch and a polymer for passivation. In some examples, a ratio of the flow rate of the $CH_4$ to the flow rate of the chlorine can be at least 1:5 ($CH_4$:$Cl_2$), such as in a range from about 1:5 ($CH_4$:$Cl_2$) to about 7:1 ($CH_4$:$Cl_2$), and more particularly, from about 5:2 ($CH_4$:$Cl_2$) to about 4:1 ($CH_4$:$Cl_2$). Increasing the flow rate of the $CH_4$ in these examples may increase selectivity between the treated portions 44 and the untreated spacer layer 42'. In some examples, a flow rate of the $CH_4$ can be in a range from about 10 standard cubic centimeter per minute (sccm) to about 80 sccm, and a flow rate of the chlorine can be in a range from about 10 sccm to about 50 sccm. A pressure of the plasma etch can be in a range from about 3 mTorr to about 50 mTorr, such as from about 5 mTorr to about 15 mTorr. A power of the plasma generator for the plasma etch can be in a range from about 100 W to about 500 W, such as from about 150 W to about 200 W. A frequency of the plasma generator for the plasma etch can be 13.56 MHz. A substrate bias power of the plasma etch can be equal to or less than about 200 W, such as equal to or less than about 100 W. The etch selectivity between the treated portions 44 and the untreated spacer layer 42' of the dry plasma etch process using the $CH_4$ and chlorine (e.g., a ratio of the etch rate of the treated portions 44 to the etch rate of the untreated spacer layer 42') can be greater than about 2 (e.g., and more particularly, greater than about 3), such as in a range from about 2 to about 50.

In other examples, the etch process is a dry plasma etch using a gas comprising hydrogen bromide (HBr). The gas used in the dry plasma etch can further include a carrier gas, such as nitrogen, argon, or the like. In some examples, a flow rate of the hydrogen bromide can be in a range from about 50 sccm to about 500 sccm, and a flow rate of the carrier gas can be in a range from about 10 sccm to about 100 sccm. A ratio of the flow rate of the hydrogen bromide to the flow rate of the carrier gas can be in a range from about 0.5 to about 7, such as from about 2.5 to about 4.5, and more particularly, about 3.5. A pressure of the plasma etch can be in a range from about 3 mTorr to about 50 mTorr, such as from about 5 mTorr to about 15 mTorr. A power of the plasma generator for the plasma etch can be in a range from about 300 W to about 2,000 W, such as from about 1,200 W to about 1,500 W. A frequency of the plasma generator for the plasma etch can be in about 13.56 MHz. A substrate bias power of the plasma etch can be in a range from about 0 W to about 200 W, such as from about 0 W to about 100 W. The etch selectivity between the treated portions 44 and the untreated spacer layer 42' of the dry plasma etch process using the HBr (e.g., a ratio of the etch rate of the treated portions 44 to the etch rate of the untreated spacer layer 42') can be greater than about 2 (e.g., and more particularly, greater than about 3), such as in a range from about 2 to about 50.

In further examples, the etch process is a wet etch using dilute hydrofluoric (dHF) acid. A ratio of hydrofluoric (HF) acid to deionized water (DIW) in the dilute hydrofluoric (dHF) acid can be 1:2,000 (HF:DIW) or more dilute. Diluting the dHF further may increase selectivity between the treated portions 44 and the untreated spacer layer 42'. A temperature of the wet etch can be at room temperature (e.g., 23° C.) or greater. The etch selectivity between the treated portions 44 and the untreated spacer layer 42' of the wet etch process using dHF (e.g., a ratio of the etch rate of the treated portions 44 to the etch rate of the untreated spacer layer 42') can be greater than about 2 (e.g., and more particularly, greater than about 3), such as in a range from about 2 to about 100.

In some examples, the selectivity of the etchant of the etch process between the treated portions 44 and the untreated spacer layer 42' (e.g., a ratio of the etch rate of the treated portions 44 to the etch rate of the untreated spacer layer 42') is about 5 or greater. In effect, the untreated spacer layer 42' acts as an etch stop for the etch process. In a specific example, the spacer layer 42 is titanium oxide; the anisotropic treatment is an anisotropic implantation of $H_2$ or He using a plasma generator with a frequency of 2 MHz at a power of 100 W; and the etch process is a dry plasma etch with a gas comprising $CH_4$ and $Cl_2$ at a ratio of 2:1 ($CH_4$:$Cl_2$).

Figure 10:
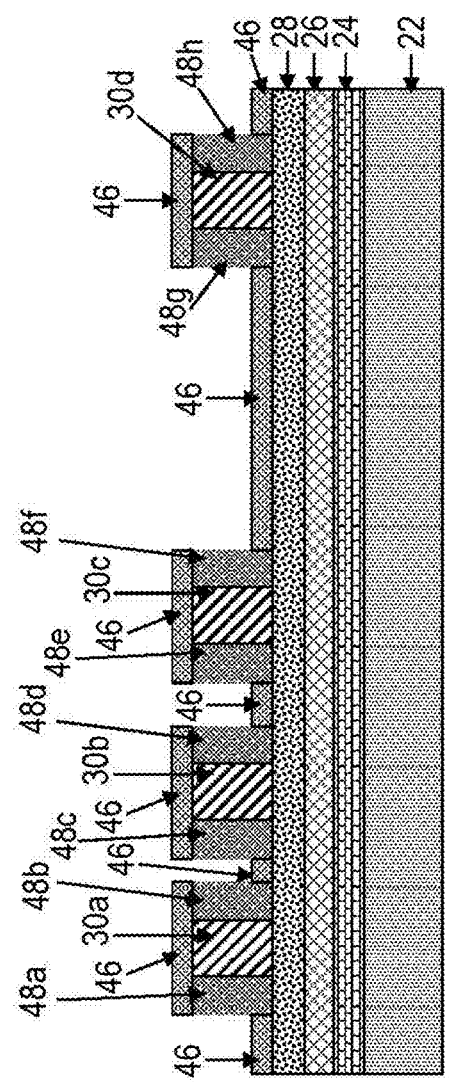

FIG. 10 illustrates the intermediate structure of FIG. 9 after further processing. Like what was described with respect to FIG. 8, an anisotropic treatment is performed on the untreated spacer layer 42'. The anisotropic treatment forms treated portions 46 from the untreated spacer layer 42'. Untreated spacer portions 48a-h remain untreated. The anisotropic treatment changes an etch selectivity between the treated portions 46 and the untreated spacer portions 48a-h. This results, in some embodiments, in a greater selectivity for etching the treated portions 46 in a subsequent etch process, as described subsequently.

The anisotropic treatment forms treated portions 44 along surfaces of the untreated spacer layer 42' that have a lateral or horizontal component. Surfaces that are vertical are not significantly treated. As illustrated in FIG. 10, the anisotropic treatment treats the untreated spacer layer 42' throughout a thickness of substantially horizontal portions of the untreated spacer layer 42' to form the treated portions 46. Thus, during the subsequent etch process, structures underlying those substantially horizontal portions (e.g., underlying the treated portions 46) can be exposed by the etch process removing the treated portions 46. Additional details of the anisotropic treatment were previously described with respect to FIG. 8, which details are not repeated here for brevity.

Figure 11:
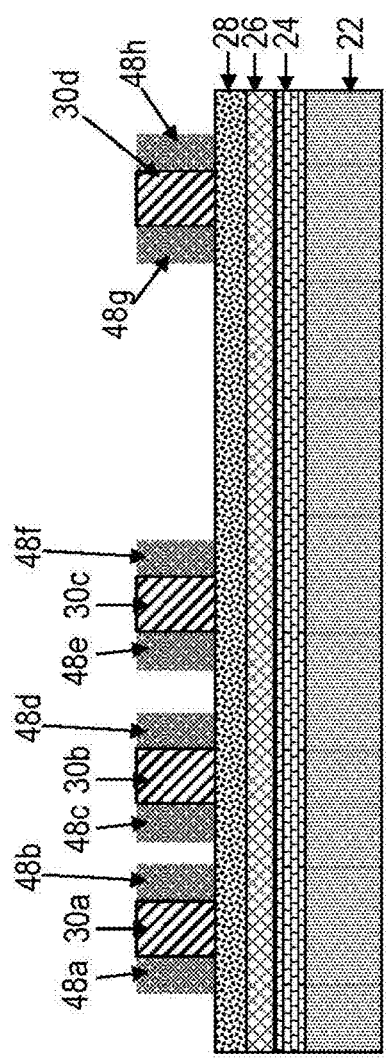

FIG. 11 illustrates the intermediate structure of FIG. 10 after further processing. An etch process is performed. Like what was described with respect to FIG. 9, the etch process has a high selectivity to etch the treated portions 46 and not to significantly etch the untreated spacer portions 48a-h. The etch process can be a wet etch or a dry etch, and may be isotropic or anisotropic, examples of which were described with respect to FIG. 9. The etch process removes the treated portions 46 to thereby expose structures, such as the patterned mandrels 30a-d and third mask sub-layer 28, underlying the treated portions 46. The vertical untreated spacer portions 48a-h remain along sidewalls of the patterned mandrels 30a-d.

The anisotropic treatment and etch process of FIGS. 8 and 9 may be performed once or repeated any number of times (e.g., to remove portions of the spacer layer 42 to increasing depths of the spacer layer 42) before proceeding to the anisotropic treatment and etch process of FIGS. 10 and 11, whereby remaining substantially horizontal portions of the spacer layer 42 are removed to expose, e.g., the patterned mandrels 30a-d and third mask sub-layer 28.

Figure 12:
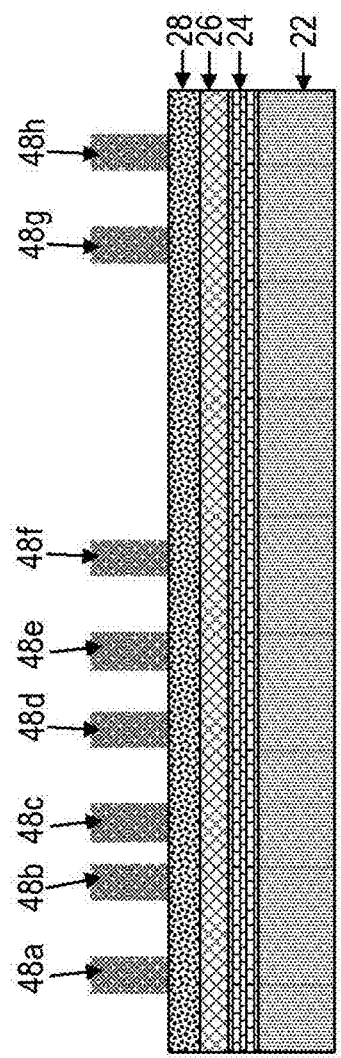

FIG. 12 illustrates the intermediate structure of FIG. 11 after further processing. The patterned mandrels 30a-d are removed. The patterned mandrels 30a-d can be removed by any suitable etch process selective to the material of the patterned mandrels 30a-d. Example etch processes can be a dry etch. For example, a dry etch process can include RIE, NBE, the like, or a combination thereof. A dry etch process can use a gas comprising one or more of carbon tetrafluoride ($CF_4$), chlorine ($Cl_2$), hydrogen bromide (HBr), or the like. For example, the dry etch process can use hydrogen bromide (HBr); a combination of carbon tetrafluoride ($CF_4$), chlorine ($Cl_2$), and hydrogen bromide (HBr); a combination of chlorine ($Cl_2$) and hydrogen bromide (HBr); and/or a combination of carbon tetrafluoride ($CF_4$) and chlorine ($Cl_2$). Oxygen ($O_2$) may also be used in the dry etch process, which may enhance selectivity of the etch process. The dry etch process can be isotropic or anisotropic.

Figure 13:
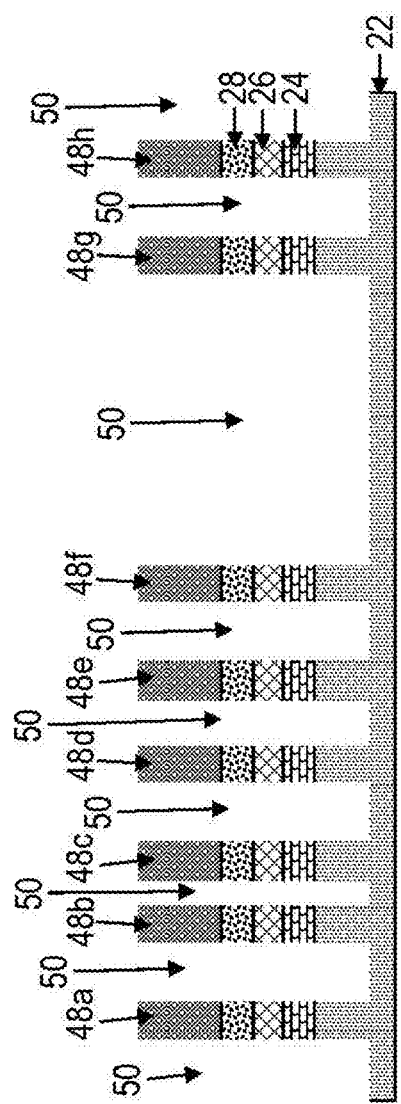

FIG. 13 illustrates the intermediate structure of FIG. 12 after further processing. The pattern of the untreated spacer portions 48a-h is transferred to the mask stack (e.g., the third mask sub-layer 28, the second mask sub-layer 26, and the first mask sub-layer 24) and into the dielectric layer 22 to form recesses 50 (and/or openings) in the dielectric layer 22. One or more etch processes may be used to form the recesses 50 in the dielectric layer 22. For example, due to different etch selectivities between the mask sub-layers 28, 26, and 24 of the mask stack and the dielectric layer 22, a different etch chemistry may be used to transfer the pattern of the untreated spacer portions 48a-h to a different layer or sub-layer. Although the untreated spacer portions 48a-h are illustrated as remaining above the mask stack in FIG. 13, various etch processes used in transferring the pattern of the untreated spacer portions 48a-h to the dielectric layer 22 may consume at least partially the untreated spacer portions 48a-h and/or portions of the mask stack.

Figure 14:
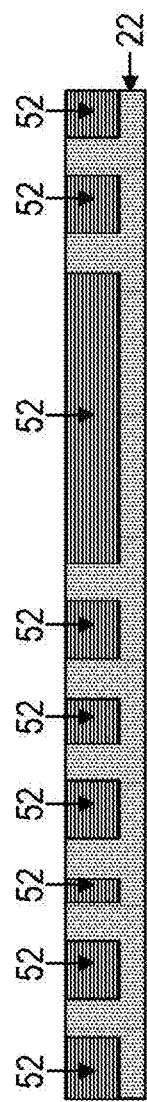

FIG. 14 illustrates the intermediate structure of FIG. 13 after further processing. Conductive features 52 are formed in the dielectric layer 22. For example, a barrier layer can be conformally deposited in the recesses 50 (and/or openings), e.g., along sidewalls and bottom surfaces, in the dielectric layer 22, and a conductive material, such as a metal like copper, tungsten, aluminum, gold, silver, an alloy thereof, the like, or a combination thereof, can be deposited on the barrier layer. The barrier layer may be deposited by any suitable deposition technique, such as ALD, CVD, the like, or a combination thereof, and the conductive material may also be deposited by a suitable deposition technique, such as PVD, CVD, ALD, the like, or a combination thereof. Any excess barrier layer and/or conductive material may be removed, such as by using a CMP to planarize top surfaces of the barrier layer and conductive material to be co-planar with the top surface of the dielectric layer 22. If any of the untreated spacer portions 48a-h and mask stack remain when the barrier layer and/or conductive material are deposited, the CMP may also remove the untreated spacer portions 48a-h and the mask stack. After the CMP, conductive features 52 remain, and the conductive features 52 may be or include conductive lines (e.g., metal lines), conductive vias, and/or conductive contacts. Although not expressly illustrated in FIG. 14, the semiconductor substrate 20 is below the dielectric layer 22.

Embodiments such as described with respect to FIGS. 1 through 14 can have advantages. As illustrated in FIG. 7, the small fourth dimension D4 formed by the spacer layer 42 on the patterned mandrels 30a and 30b can create a high aspect ratio (e.g., third aspect ratio AR3) for etching. Using previous etch processes, the high aspect ratio can cause etch rates that are different from etch rates in other regions with lower aspect ratios, such as at the fifth dimension D5 (e.g., fourth aspect ratio AR4). Different etch rates could cause punch-through at areas with large dimensions while not etching fully the desired portion at areas with small dimensions, for example. Further, byproducts from the etch process can build up at footings in high aspect ratio regions using conventional etch techniques. This can cause poor profiles for spacers. However, using an anisotropic treatment and etch process according to some embodiments can overcome at least some of these challenges. The selectivity of the etchant of the etch process that was created by the anisotropic treatment can permit for greater control of the etching, which can permit for more even etching rates between areas with a high aspect ratio and a low aspect ratio. Additionally, in some embodiments, profiles of spacers can be made to have more vertical exterior sidewall surfaces, as described in further detail below with respect to FIGS. 15 through 22. This can overcome some challenges with top and bottom loading that may otherwise occur. As semiconductor technologies continue to evolve to smaller technology nodes, such as 7 nm, 5 nm, or smaller, some embodiments may overcome challenges presented by the scaling down of feature sizes.

FIGS. 15 through 22 illustrate cross-sectional views of respective intermediate structures during an example method for patterning structures, in accordance with some embodiments. In this example method illustrated in FIGS. 15 through 22, profiles of spacers (or other structures) can be trimmed using an anisotropic treatment and etch process as described in the preceding example. Various aspects of the different methods may be combined, as a person having ordinary skill in the art will readily understand, to implement other methods consistent with this disclosure.

Figure 15:
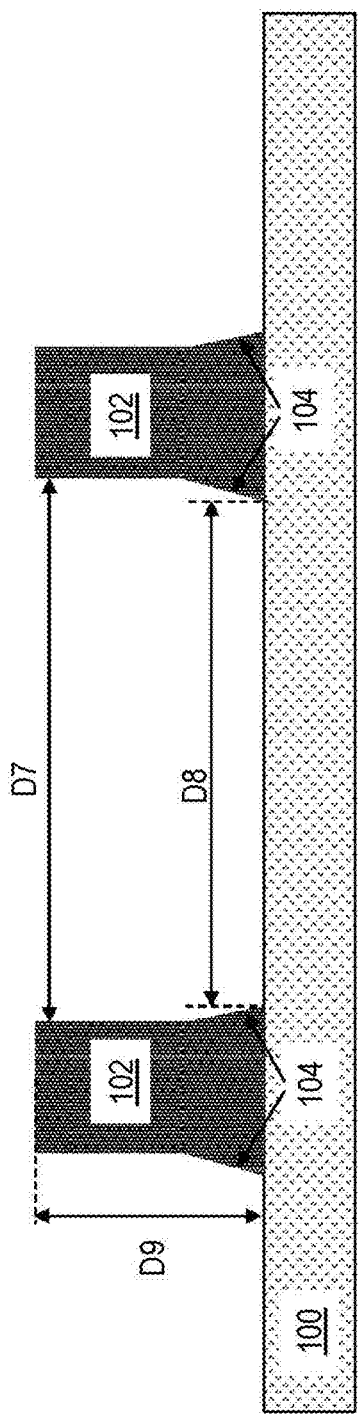

FIG. 15 illustrates patterned structures 102 formed on a substrate 100. Depending on the implementation, the patterned structures 102 can be any patterned structure. For example, the patterned structures 102 can be a mandrel like one of the patterned mandrels 30a-d in the preceding figures, a gate structure for a transistor, or another structure. The substrate 100 can be a layer (e.g., a dielectric layer) over a semiconductor substrate or can be the semiconductor substrate (e.g., an active area of a semiconductor substrate). For the purposes of description herein, the patterned structures 102 are patterned mandrels like in preceding figures, and the substrate 100 includes a mask stack like in preceding figures. Patterned mandrels can be patterned like described in FIGS. 1 through 6, for example.

The process(es) for patterning the patterned structures 102 can result in the profiles of the patterned structures 102 having irregularities, such as flared surfaces 104 (e.g., where the profile of the patterned structure 102 widens) at a bottom portion of the respective patterned structure 102. To illustrate this, a seventh dimension D7 is between facing sidewalls of the patterned structures 102 at respective tops of the patterned structures 102, and an eighth dimension D8 is between the facing sidewalls of the patterned structures 102 at respective bottoms of the patterned structures 102. Further, each of the patterned structures 102 has a ninth dimension D9 (e.g., a height) from a top surface of the substrate 100 to the top surface of the respective patterned structure 102. The spacing between the patterned structures 102 can have a fifth aspect ratio AR5 (e.g., a ratio of the ninth dimension D9 to the seventh dimension D7 in the illustrated example of FIG. 15) that can be greater than about 0.8 (e.g., and more particularly, greater than about 1.5), such as in a range from about 0.8 to about 6. If the fifth aspect ratio AR5 is large, such as greater than 3, the efficacy of an etch process in patterning the patterned structures 102 can be reduced at the bottom of the patterned structures 102, which can cause irregularities like the flared surfaces 104. For example, etchant gases may be inhibited from reaching the bottom portions of the patterned structures 102 where the aspect ratio is large relative to etchant gases that reach the bottom portions of patterned structures 102 where the aspect ratio is small. Due to the flared surfaces 104 of the patterned structures 102, the eighth dimension D8 is smaller than the seventh dimension D7. The greater the fifth aspect ratio AR5 is, the larger the difference between the seventh dimension D7 and the eighth dimension D8 can be.

Figure 16:
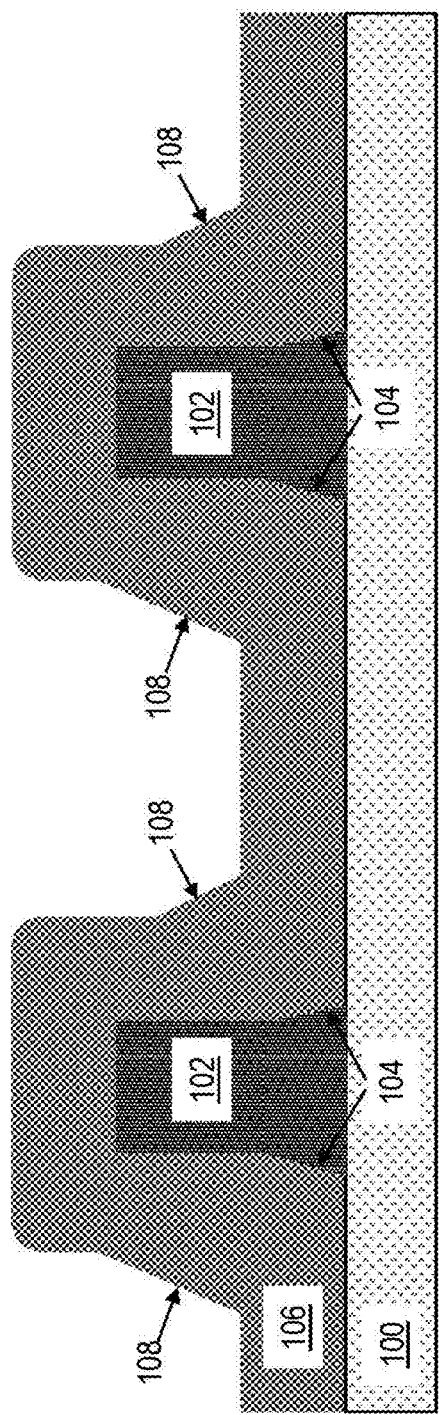

FIG. 16 illustrates the formation of a spacer layer 106 on the substrate 100 and the patterned structures 102. The spacer layer 106 is formed conformally on the patterned structures 102 and the substrate 100. The spacer layer 106 may be, for example, titanium oxide, titanium nitride, silicon nitride, or another acceptable material, and may be formed using CVD, ALD, or another deposition technique. The spacer layer 106 may have a thickness in a range from about 5 nm to about 23 nm, and more particularly, from about 9 nm to about 18 nm. Because of the conformal deposition of the spacer layer 106, surfaces of the underlying topography can be replicated to surfaces of the spacer layer 106. Hence, the spacer layer 106 has flared surfaces 108 corresponding to the flared surfaces 104 of the patterned structures 102.

FIG. 17 illustrates the formation of spacers 112 along sidewalls of the patterned structures 102. The spacer layer 106 is anisotropically etched to form the spacers 112 along the sidewalls of the patterned structures 102. The anisotropic etch process can be any suitable etch process, such as RIE, NBE, the like, or a combination thereof.

Because of the anisotropic etching of the spacer layer 106 to form the spacers 112, the flared surfaces 108 of the spacer layer 106 can be replicated to flared surfaces 116 of the spacers 112, and further, the anisotropic etching can increase how much the flared surfaces 116 are flared relative to the flared surfaces 108 of the spacer layer 106 and/or the flared surfaces 104 of the patterned structures 102. To illustrate the increased flaring, a tenth dimension D10 is between facing sidewalls of the spacers 112 at respective tops of the spacers 112, and an eleventh dimension D11 is between the facing sidewalls of the spacers 112 at respective bottoms of the spacers 112. Further, each of the spacers 112 has a twelfth dimension D12 (e.g., a height) from a top surface of the substrate 100 to the top surface of the respective spacers 112. The spacing between the spacers 112 can have a sixth aspect ratio AR6 (e.g., a ratio of the twelfth dimension D12 to the tenth dimension D10 in the illustrated example of FIG. 17) that can be greater than about 2 (e.g., and more particularly, greater than about 4), such as in a range from about 2 to about 12. If the sixth aspect ratio AR6 is large, such as greater than 6, the efficacy of the anisotropic etch process in forming the spacers 112 can be reduced at the bottom of the spacers 112, which can cause increasing flaring like the flared surfaces 116. For example, etchant gases may be inhibited from reaching the bottom portions of the spacers 112 where the aspect ratio is large relative to etchant gases that reach the bottom portions of spacers 112 where the aspect ratio is small. Due to the flared surfaces 116 of the spacers 112, the eleventh dimension D11 is smaller than the tenth dimension D10. The greater the sixth aspect ratio AR6 is, the larger the difference between the tenth dimension D10 and the eleventh dimension D11 can be. The difference between the tenth dimension D10 and the eleventh dimension D11 can be larger than the difference between the seventh dimension D7 and the eighth dimension D8. The flared surfaces 116 of the spacers 112 have both a horizontal component Ch and a vertical component Cv.

FIG. 18 illustrates an anisotropic treatment performed on the spacers 112. The anisotropic treatment forms treated portions 118 from the spacers 112. The treated portions 118 extend a vertical depth (e.g., a depth perpendicular from horizontal) from surfaces of the spacers 112 that have a horizontal component, such as top surfaces of the spacers 112 and the flared surfaces 116. Untreated spacers 112' remain below this vertical depth from the surfaces of the spacers 112 that have a horizontal component and remain at vertical surfaces. The anisotropic treatment changes an etch selectivity between the treated portions 118 and the untreated spacers 112'. This results, in some embodiments, in a greater selectivity for etching the treated portions 118 in a subsequent etch process, as described subsequently. The anisotropic treatment can be the same as or similar to the anisotropic treatment described above with respect to FIG. 8, which description is omitted here for brevity.

FIG. 19 illustrates the performance of an etch process to remove the treated portions 118. The etch process has a high selectivity to etch the treated portions 118 and to not significantly etch the untreated spacers 112'. In some examples, the selectivity of the etchant of the etch process between the treated portions 118 and the untreated spacers 112' (e.g., a ratio of the etch rate of the treated portions 118 to the etch rate of the untreated spacers 112') is about 5 or greater. In effect, the untreated spacers 112' act as etch stops for the etch process. The etch process can be the same as or similar to the etch process described above with respect to FIG. 9, which description is omitted here for brevity.

The removal of the treated portions 118 causes the untreated spacers 112' to have reduced flared surfaces 120 with a reduced horizontal component Ch' at a lower portion of the profile of the untreated spacers 112'. The reduced horizontal component Ch' of the reduced flared surface 120 is reduced in comparison to the original horizontal component Ch of the flared surface 116.

Figure 21:
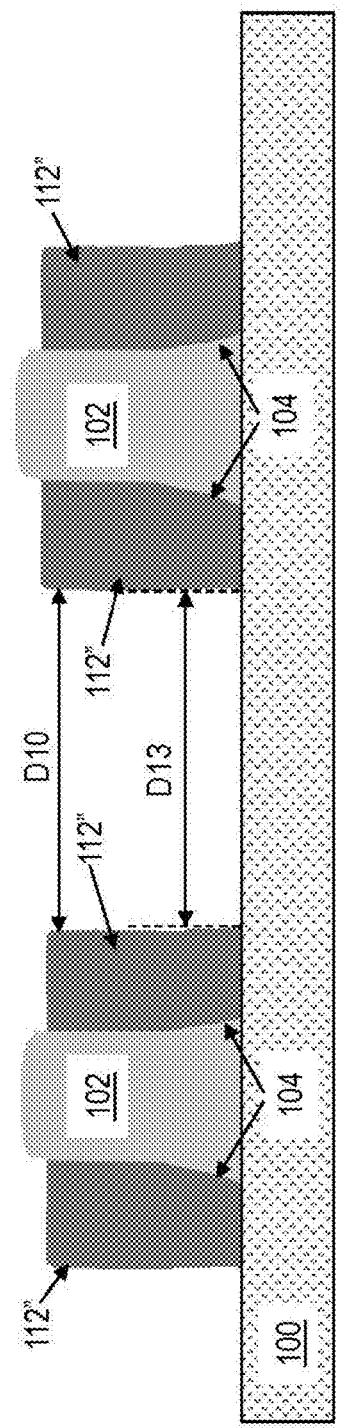

FIGS. 20 and 21 illustrate repetition of the anisotropic treatment and etch process of FIGS. 18 and 19, respectively, to remove flared surfaces from the spacers 112'. As shown in FIG. 20, the anisotropic treatment forms treated portions 122 from the spacers 112'. The treated portions 122 extend a vertical depth (e.g., a depth perpendicular from horizontal) from surfaces of the spacers 112' that have a horizontal component, such as top surfaces of the spacers 112' and the reduced flared surfaces 120. Untreated spacers 112" remain below this vertical depth from the surfaces of the spacers 112' that have a horizontal component and remain at vertical surfaces. As shown in FIG. 21, the etch process removes the treated portions 122 leaving untreated spacers 112" with substantially vertical exterior sidewall surfaces that do not have a horizontal component.

The anisotropic treatment and etch process can be performed once or repeated any number of times to achieve a desired profile of the spacers. In some instances, after performing the anisotropic treatment and etch process any number of times, spacers can have exterior sidewall surfaces that are flared with a horizontal component or that are vertical without a horizontal component. The anisotropic treatment and etch process can permit tuning the profile to have any desired amount of a horizontal component to an exterior sidewall surface of a spacer. As illustrated in FIG. 21, the tenth dimension D10 (e.g., of FIG. 17) is between facing sidewalls of the spacers 112" at respective tops of the spacers 112", and a thirteenth dimension D13 is between the facing sidewalls of the spacers 112" at respective bottoms of the spacers 112". A difference of the tenth dimension D10 minus the thirteenth dimension D13 can be less than about 2.0 nm, such as about 0.

Figure 22:
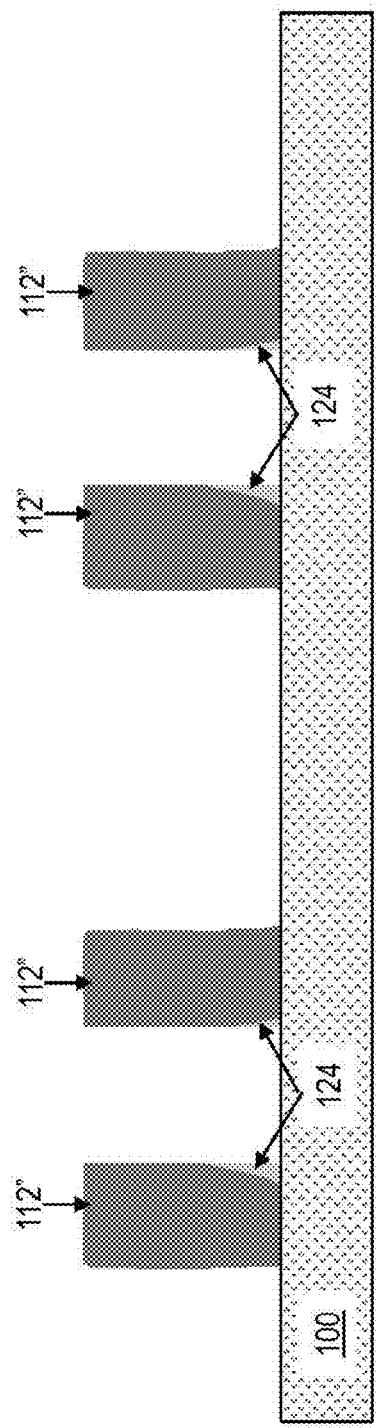

FIG. 22 illustrates the removal of the patterned structures 102. The patterned structures 102 can be removed using an etch process selective to the materials of the patterned structures 102. Example etch processes can be a dry etch. For example, a dry etch process can include RIE, NBE, the like, or a combination thereof. A dry etch process can use a gas comprising one or more of carbon tetrafluoride ($CF_4$), chlorine ($Cl_2$), hydrogen bromide (HBr), or the like. For example, the dry etch process can use hydrogen bromide (HBr); a combination of carbon tetrafluoride ($CF_4$), chlorine ($Cl_2$), and hydrogen bromide (HBr); a combination of chlorine ($Cl_2$) and hydrogen bromide (HBr); and/or a combination of carbon tetrafluoride ($CF_4$) and chlorine ($Cl_2$). Oxygen ($O_2$) may also be used in the dry etch process, which may enhance selectivity of the etch process. The dry etch process can be isotropic or anisotropic. In some examples where the etch process is anisotropic, residual portions 124 of the patterned structures 102 can remain corresponding to portions at the flared surfaces 104 of the patterned structures 102. In other examples, an isotropic etch process is used, and respective entireties of the patterned structures 102 can be removed.

As illustrated by FIGS. 15 through 22, some embodiments can achieve the advantage of tuning profiles of structures. Horizontal components of sidewall surfaces can be reduced or removed. This may be beneficial when etching high aspect ratio openings to remove build-up of byproducts and to address loading issues resulting from underlying structures, for example. Other advantages may be achieved in other contexts and embodiments.

An embodiment is a method. An etch selectivity between a first portion of a material and a second portion of the material is increased. Increasing the etch selectivity includes performing an anisotropic treatment on the material to treat the first portion of the material, and the second portion of the material remains untreated after the anisotropic treatment. After increasing the etch selectivity, the first portion of the material is etched.

Another embodiment is a method. Ions are anisotropically implanted into a first portion of a material. A second portion of the material is not implanted with ions during the anisotropic implantation. The first portion of the material implanted with ions is etched. Etching the first portion uses an etchant that has a first etch rate of the first portion of the material implanted with ions and a second etch rate of the second portion of the material. The first etch rate is greater than the second etch rate.

A further embodiment is a method. A spacer layer is conformally formed along a mandrel. A first horizontal portion of the spacer layer is over the mandrel. A spacer portion of the spacer layer is along a sidewall of the mandrel. A second horizontal portion of the spacer layer is disposed laterally from the mandrel. Ions are implanted into the first horizontal portion and the second horizontal portion. The first horizontal portion and the second horizontal portion, including the implanted ions, are etched with an etchant that etches the first horizontal portion and the second horizontal portion at a greater rate than the spacer portion.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
   forming a first structure over a substrate, the first structure having flared lower sidewalls;
   forming a material over the first structure;
   increasing an etch selectivity between a first portion of the material and a second portion of the material, increasing the etch selectivity comprising performing an anisotropic treatment on the material to treat the first portion of the material, the second portion of the material remaining untreated after the anisotropic treatment;
   after increasing the etch selectivity, etching the first portion of the material; and
   after etching the first portion of the material, removing at least a portion of the first structure to expose the substrate, wherein a portion of the flared lower sidewalls remains after removing the portion of the first structure to expose the substrate.

2. The method of claim 1, wherein the anisotropic treatment is an anisotropic ion implantation.

3. The method of claim 2, wherein the anisotropic ion implantation implants helium (He), hydrogen ($H_2$), or a combination thereof.

4. The method of claim 2, wherein the anisotropic ion implantation uses a plasma generator with a frequency of 2 MHz and a power of equal to or greater than 50 W.

5. The method of claim 2, wherein the anisotropic ion implantation uses a plasma generator with a frequency of 13.56 MHz and a power of equal to or greater than 30 W.

6. The method of claim 1, wherein the etching is an isotropic etch.

7. The method of claim 1, wherein the etching is an anisotropic etch.

8. The method of claim 1, wherein the etching is a wet etch.

9. The method of claim 8, wherein the wet etch uses an etchant comprising dilute hydrofluoric (dHF) acid.

10. The method of claim 1, wherein the etching is a dry etch.

11. The method of claim 10, wherein the dry etch uses an etchant comprising chlorine ($Cl_2$) and $CH_4$.

12. The method of claim 10, wherein the dry etch uses an etchant comprising hydrogen bromide (HBr).

13. A method comprising:
    forming a structure on a substrate;
    forming a material on the substrate and the structure;
    anisotropically implanting ions into a first portion of the material, wherein a second portion of the material is not implanted with ions during the anisotropically implanting ions;
    etching the first portion of the material implanted with ions, wherein the etching uses an etchant having a first etch rate of the first portion of the material implanted with ions and a second etch rate of the second portion of the material, the first etch rate being greater than the second etch rate, wherein etching the first portion exposes the structure; and
    exposing a portion of the substrate by removing at least a first portion of the structure, wherein a second portion of the structure remains.

14. The method of claim 13, wherein the first etch rate is at least five times greater than the second etch rate.

15. The method of claim 13 further comprising repeatedly performing the anisotropically implanting ions and the etching.

16. The method of claim 13, wherein the first portion of the material has a surface having a horizontal component, wherein ions are anisotropically implanted through the surface having the horizontal component during the anisotropically implanting ions.

17. A method comprising:
    forming a mandrel on a first portion of a substrate;
    conformally forming a spacer layer along the mandrel, a first horizontal portion of the spacer layer being over the mandrel, a spacer portion of the spacer layer being along a sidewall of the mandrel, and a second horizontal portion of the spacer layer being disposed laterally from the mandrel;
    implanting ions into the first horizontal portion and the second horizontal portion;
    etching the first horizontal portion and the second horizontal portion, including the implanted ions, with an etchant that etches the first horizontal portion and the second horizontal portion at a greater rate than the spacer portion; and
    removing a first portion of the mandrel to expose the first portion of the substrate, wherein a second portion of the mandrel remains interposed between remaining portions of the spacer layer and the substrate along a direction orthogonal to a surface of the substrate underlying the second portion of the mandrel.

18. The method of claim 17 further comprising repeatedly performing the implanting ions and the etching sequentially.

19. The method of claim 17, wherein the implanting ions anisotropically implants ions into the first horizontal portion and the second horizontal portion.

20. The method of claim 17 further comprising, using the spacer portion as a mask, patterning a layer underlying the spacer portion.

* * * * *